United States Patent
Turner et al.

(10) Patent No.: US 6,794,272 B2
(45) Date of Patent: Sep. 21, 2004

(54) WAFER THINNING USING MAGNETIC MIRROR PLASMA

(75) Inventors: Terry R. Turner, Austin, TX (US); James D. Spain, Georgetown, TX (US); Richard M. Banks, Austin, TX (US)

(73) Assignee: iFire Technologies, Inc., Austin, TX (US)

(*) Notice: Subject to any disclaimer, the term of this patent is extended or adjusted under 35 U.S.C. 154(b) by 0 days.

(21) Appl. No.: 10/390,977

(22) Filed: Mar. 18, 2003

(65) Prior Publication Data

US 2003/0186513 A1 Oct. 2, 2003

Related U.S. Application Data

(63) Continuation-in-part of application No. 10/133,296, filed on Apr. 26, 2002, now abandoned.
(60) Provisional application No. 60/336,786, filed on Oct. 26, 2001.

(51) Int. Cl.[7] .............................................. H01L 21/78
(52) U.S. Cl. ........................ 438/459; 438/464; 438/691; 438/977
(58) Field of Search ................................ 438/113, 458, 438/459, 462, 464, 691, 977

(56) References Cited

U.S. PATENT DOCUMENTS

| | | | | |
|---|---|---|---|---|
| 4,330,384 A | * | 5/1982 | Okudaira et al. | 204/192.37 |
| 4,609,428 A | * | 9/1986 | Fujimura | 438/728 |
| 6,162,703 A | * | 12/2000 | Muntifering et al. | 438/465 |
| 6,184,060 B1 | | 2/2001 | Siniaguine | |
| 6,245,677 B1 | * | 6/2001 | Haq | 438/690 |
| 6,284,668 B1 | | 9/2001 | Imahashi | |
| 6,322,903 B1 | | 11/2001 | Siniaguine et al. | |
| 2001/0001215 A1 | * | 5/2001 | Siniaguine et al. | 257/618 |

* cited by examiner

Primary Examiner—Tuan H. Nguyen
Assistant Examiner—Stephen W. Smoot
(74) Attorney, Agent, or Firm—John A. Fortkort; Hulsey Grether & Fortkort LLP (57) ABSTRACT

A method for manufacturing integrated circuits uses an atmospheric magnetic mirror plasma etching apparatus to thin a semiconductor wafer. In addition the process may, while thinning, both segregate and expose through-die vias for an integrated circuit chip. To segregate, the wafer may be partially diced. Then, the wafer may be tape laminated. Next, the backside of the wafer may be etched. As the backside material is removed, the partial dicing and through-die vias may be exposed. As such, the method reduced handling steps and increases yield. Furthermore, the method may be used in association with wafer level processing and flip chip with bump manufacturing.

19 Claims, 8 Drawing Sheets

WAFER THINNING USING MAGNETIC MIRROR PLASMA

RELATED APPLICATIONS

This application is a continuation-in-part of U.S. patent application Ser. No. 10/133,296 (now abandoned) filed on Apr. 26, 2002 and incorporated herein by reference in its entirety, which claims priority from U.S. Provisional Patent Application Ser. No. 60/336,786, filed on Oct. 26, 2001 and entitled "Wafer Thinning Process", and which is also incorporated herein by reference in its entirety.

TECHNICAL FIELD OF THE INVENTION

This invention relates in general to a system and method for integrated circuit manufacturing. More specifically, this application relates to a system and method for thinning integrated circuit wafers which include using a magnetic mirror plasma process.

BACKGROUND OF THE INVENTION

The increasing demand for portable products is driving semiconductor device design to place a premium on package size and density (smaller, thinner, cheaper, and with higher functionality per unit volume). Packaging has become one of the most critical enabling technologies for future integrated circuit (IC) generations due to the perpetually increasing needs for higher electrical performance, increased densities, and miniaturization. Addressing the size and efficiency of packaging devices, two technology enablers have been introduced over the last five years: Chip scale packaging ("CSP") including ball grid array ("BGA") and Flip Chip ("bumped"), and Wafer level packaging ("WLP"). However, typical wafer thinning technologies cannot be used to achieve the preferred finished part thickness without damage.

With other components of the final package already thinned as much as possible, further reductions in package thickness require thinning of the die itself. Manufacturers need wafer thinning technology that can enable the wafer level packaging ("WLP") and flip chip packaging utilizing bump to meet ultra thin packaged part demands for portable, wireless and memory intensive applications. As consumption continues to increase for miniature IC packages, yield becomes critical. Typical technologies that require significant process steps in multiple tools cannot evolve and typical "workarounds" are a short-term solution.

Typical wafer thinning methods for WLP and flip chip manufacturing utilizing bump suffer from deficiencies in throughput, yield and breakage, damage, automation and integration, number of process steps, and cost of ownership.

Traditional packaging approaches constitute the first category called chip scale packaging ("CSP") and are characterized by package processes operating on individual, separated die. Typically in CSP processes, the wafer is thinned, diced and placed into a package. Until recently, CSP resulted in packaged parts typically occupying several times the area of the die. Modem CSP BGA and flip chip processes can provide devices at or close to die size. However, as with other CSP processes it is still required to handle discrete die and, in an attempt to improve throughput, discrete die are often "batched" in strips or trays in an attempt to gain some economies of scale.

Wafer level packaging ("WLP") presents an alternative to CSP and as such constitutes the second major category of packaging. WLP processes are based on the concept of creating the package prior to dicing the wafer. WLP by definition results in packaged parts no larger than the size of the die. In addition the wafer acts as a chip carrier and as such optimizes economies of scale for packaging. WLP offers better electrical performance of the packaged part than most CSP technologies due, in part, to reduced parasitic capacitance. The resulting part is surface mount ready. The costs of the package go down as the wafer size goes up and the packaging process can be done in the back end of line ("BEOL") portion of a traditional wafer fabrication facility further reducing costs and dependencies to the integrated device manufacturer ("IDM"). As such, WLP could represent significant cost savings over typical technologies.

A shared process component of WLP fabrication with CSP technology is wafer thinning. Industry trends point to reductions in chip thickness of about 5% per year each year since wafer thinning became a requirement. This trend is expected to continue and will contribute significantly to enabling the industry to continue increasing component density. In addition to volume advantages, there are important performance benefits to reducing the thickness of silicon die that can be categorized as both device performance and reliability enhancements including thermal resistance, device reliability, and die stacking. Thinning the die reduces the serial thermal resistance between the active circuitry and the backside of the chip which can be in contact with a heat sink. Thermal resistance is a critical parameter for a variety of chips, such as power and high-speed microprocessors in which overheating can cause failure.

Thickness may also be related to device reliability: Thin die minimize the stress on the device circuitry due to mismatches between the coefficients of thermal expansion (CTE) of materials within the packaged device. Expansion of the different materials in a WLP device and the PCB or flex-circuit on which it is mounted produce opportunities to shear bonds at the interface of the solder ball/bump and the mating pad. Broken or damaged bonds result in failed components.

Thin die may also permit IC stacking for vertical device integration. It is desirable to fit chip stacks inside standard packages, but this requires thin die (i.e., die must be thinned in order to be used in vertical memory stacks). Chip-stack designs are also attractive for the combination of logic/memory, optical/electrical, analog/digital ("mixed signal") and micro electromechanical systems (MEMS).

There are three conventional methods of wafer thinning: mechanical grinding, chemical-mechanical polishing (CMP), and wet etching. Typically, mechanical grinding thins wafers by pressing a rotating abrasive disk to the backside of a wafer. CMP typically uses a rotating pad with a silica solution. A typical wet etching process uses a liquid phase chemical reaction.

Mechanical grinding is the most commonly used process to thin wafers. However, it induces significant stress and damage to the wafer, which must be removed by subsequent processing. Typically either a wet etch or CMP process is used to reduce the grind-induced stress. The stress may cause the wafer to break or may damage the devices on the wafer. The breakage and damage is a function of the thickness of the wafer relative to its diameter. In typical applications, mechanical grind is limited to the manufacturing of wafers with a finished thickness to diameter ratio of greater than 1 $\mu$m/mm. As such, larger wafers could only be ground to greater thickness. For example, a 100 mm diameter wafer could be mechanically ground to 100 $\mu$m thick. However, a 300 mm diameter wafer could only be ground to 300 μm. Since manufacturing economies improve with larger thinner wafers, mechanical grinding alone is unacceptable.

In addition, mechanical grinding can cause warping from induced stress. Warping can lead to breakage in subsequent steps and damage to the silicon lattice resulting in degraded device performance. Furthermore, the post grind steps necessary to remove the induced stress decrease throughput, increase process steps, require additional handling of already thinned and possibly warped wafers, and present other difficulties, as well. Finally, ultra thin wafers cannot be created through the mechanical grind process alone.

On the other hand, CMP cannot be used on WLP devices or bumped wafers due to the high pressure placed in the backside of the wafer. Furthermore, CMP has a low throughput. The removal rate is not acceptable for production processing. Although the oldest technique for silicon etching in the industry, wet etching has disadvantages for wafer thinning due to inherent process control difficulties. Also, wet etching requires hazardous chemicals with high disposal costs due to environmental issues. Wet etching has low market penetration of wafer thinning tools due to expense and environmental issues.

Each of these wafer thinning methods add handling steps and expense. Each handling step reduces yield and slows throughput. Moreover, mechanical grind and CMP prevent using solder bump techniques typically incorporated in flip chip and WLP and limit thinning.

As such, many typical wafer thinning technologies are ill-suited for wafer thinning in WLP or flip chip manufacturing. Many other problems and disadvantages of the prior art will become apparent to one skilled in the art after comparing such prior art with the present invention as described herein.

SUMMARY OF THE INVENTION

Aspects of the invention are found in a system for thinning wafers. The system comprises a type of dry plasma etcher that utilizes a magnetic mirror technique (i.e., a "magnetic mirror plasma") and may have one or more additional etchers. The additional etchers may comprise dry etchers, wet etchers, or a combination of dry and/or wet etchers. The potential additional dry etchers may comprise, for example, one or more ion-miller, plasma, or reactive ion etchers, among others. The dry etchers may operate at pressures at, below, or above atmospheric pressure. Further, each plasma etcher may use various means of forming a plasma, including, for example, microwave, radio frequency, inductive, and arc methods, among others. Similarly, the wet etcher may utilize various chemicals. These chemicals may be, for example, customized for the material being etched. Moreover, the various chemicals or chemical combinations may be selected for their degree of specificity and isotropic nature.

An aspect of the invention may be found in a magnetic mirror plasma. A magnetic mirror plasma uses a unique method to confine a plasma using a magnetic mirror field and an orthogonally rotating electric field. The vector cross product of these orthogonal fields provides the capability for control of ion momentum parallel to the magnetic field lines while leveraging the ion's angular momentum to optimize dissociation of complex process gases into neutral reactive species. Further, to ensure the proper flow control and barrier to neutral partial diffusion, a chamber constructed of non-ferrous material is used to house the substrate being processed. Lastly, the ions confined with the magnetic mirror plasma are created remote to the confinement by an ion source of many possible types.

Magnetic mirror fields have historically been used in high energy physics experiments and efforts such as fusion energy. For this reason most prior art may be found in patents granted to the U.S. Department of Energy. Magnetic mirror fields have typically not been used in the most common plasma process application of semiconductor thin film etch and deposition due to substrate damage. In the case of high energy physics and fusion energy experimentation, substrate processing is not the objective. Rather, plasma confinement is the primary objective of these high energy experiments and as such orthogonal electric fields have been considered to be a detriment.

Another aspect of the invention may be found in a method of segregating IC chips contained within a wafer. The wafer may be first diced, grooved, notched, scored, or etched, among others, on a first side to form a groove, notch, hole, indentation, or channel, among others. The front side of the wafer may then be taped or laminated. Next, an etching process may be used on the backside of the wafer to thin the wafer to a thickness less than or equal to the depth of the groove, notch, hole, indentation, or channel. The etching portion of this method comprises using a magnetic mirror plasma etching technique and may further comprise a plasma etching technique, wet etching technique, dry etching technique, or a combination of those techniques, among others. The method may also be used to form holes or punch-throughs in the wafer or IC chip. These punch-throughs may, for example, allow electrical contact with front side circuitry. Alternately, they may be used as structural elements in MEMs. However, the holes or punch-throughs may have various uses.

A further aspect of the invention may be found in a method for simultaneously segregating IC chips contained within a wafer and exposing vias on the backside of an IC chip. Vias may be formed on the front side of the wafer with a first depth. In addition, the front side may be diced, grooved, scored, etched, or notched to second depth. The second depth may or may not be the same as the first depth. Next, the wafer may be taped or laminated. The back-side of the wafer may then be etched to a depth that both exposes the vias and the groove, score, hole, indentation, or channel. The etching portion of this method comprises using a magnetic mirror plasma etching technique and may further comprise a plasma etching technique, wet etching technique, dry etching technique, or a combination of those techniques, among others. Another aspect of the invention may be found in pre-thinning a wafer with a conventional technique, followed by etching to expose vias, grooves, and or holes.

Other aspects of the invention may be found in methods for manufacturing IC chips, micro-electro-mechanical systems, and semiconductor wafers with low variance thickness among others.

As such, a method and system for wafer segregation and thinning is described. Other aspects, advantages and novel features of the present invention will become apparent from the detailed description of the invention when considered in conjunction with the accompanying drawings.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE PREFERRED EMBODIMENT

WLP and flip chip with bump designs are useful for applications where higher functionality per unit volume is required and not available with conventional packaging approaches. These include, but are not limited to, portable, battery powered devices like cell phones, personal digital assistants, notebook computers, camcorders, and smart cards, among others. Moreover, functional and performance improvements such as stacked die, better temperature survivability and faster performance (due to reduced parasitic capacitance) may be achieved with thinner wafers.

In wafer level processing (WLP), processing steps such as final test, burn-in, and memory array repair may be performed prior to segregation. Economies improve with larger wafers. However, larger wafers typically have greater thickness to prevent breakage during front side processing. Typical wafer thinning techniques are limited in the thickness they may achieve.

Figure 1:
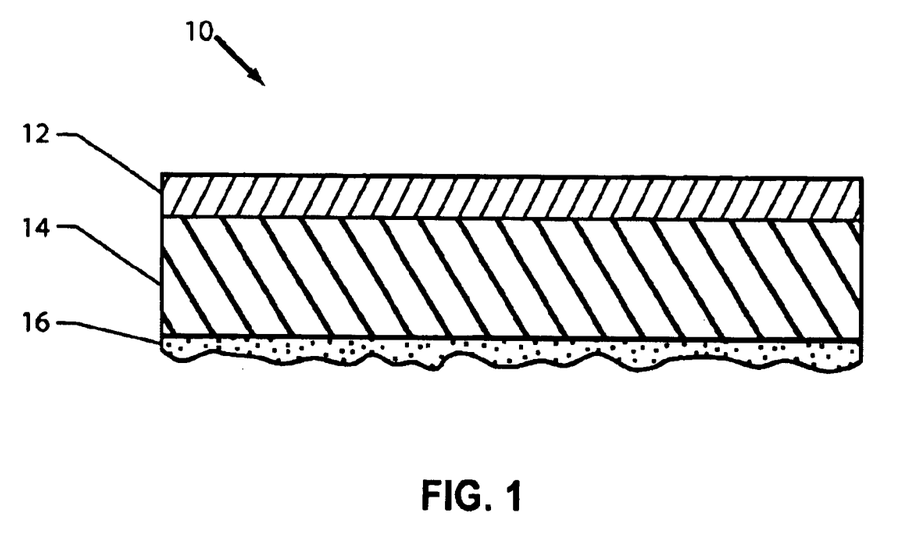
FIG. 1 is a cross sectional illustration of a wafer substrate.

FIG. 1 is a cross section illustration of an exemplary wafer. The wafer 10 may have a layer incorporating integrated circuit devices 12, a layer of bulk wafer material 14 and a layer of residue 16. FIG. 1 is for illustration purposes only and, as such, may not be drawn to scale.

The layer incorporating IC devices 12 may typical have a thickness from 8–15 $\mu$m. However, the thickness may be more or less. For example the layer may be 50 $\mu$m or greater. Alternately, the layer may be 5 $\mu$m or less. The layer incorporating IC devices 12 may be composed of various semiconductor materials, dielectric materials, metals, metal oxides, and polymers, among others. These may include various oxides, nitrides, and oxynitrides of silicon. Further these may include gold, titanium, copper, aluminum, tungsten, nickel, vanadium, various metal alloys, gallium arsenide, germanium, doped silicon, doped silicon dioxide, and polymers, among others.

The bulk wafer material layer 14 may have an initial thickness of 650 $\mu$m or more. However, the layer 14 may have a thickness that is greater or less than 650 $\mu$m. Furthermore, the thickness may vary with the diameter of the wafer. To prevent breakage, larger wafers typically have a greater initial thickness. For example, a 300 mm-diameter wafer may initially have a 850 $\mu$m thickness. Whereas, a 200 mm-diameter wafer may initially have a 750 $\mu$m thickness and a 100 mm-diameter wafer may initially have a 650 $\mu$m thickness. However, various wafer diameters may have varying wafer thickness. The bulk wafer material may take various forms. These forms may include various semiconductor materials such as, silicon, germanium, and gallium arsenide, among others. Further these forms may include polymeric, crystalline, and other materials.

The residue layer 16 may or may not be layered on the wafer. A residue may result from various processing steps associated with the device manufacturing on the front side of the wafer and the IC layer. For example, the residue may consist of various materials including silicon dioxide, silicon nitrate, various photoresist polymers, dopants, metals, metal oxides, dust, oils, and substrate particles, among others.

According to the invention, the wafer 10 may be thinned by removing the bulk wafer material and the residue material from the layers 14 and 16, respectively. The wafer may be thinned, for example, using various etching technologies. These etching technologies may include dry etching and/or wet etching, among others. The dry etching may include plasma etching, ion milling, and reactive ion etching, among others. The wet etching technologies may include nitric, sulfuric, or phosphoric acids, among others. Alternately, it may include potassium hydroxide, among others.

Furthermore, the differing etching techniques and chemistries may be used to remove various materials and layers. These techniques and chemistries may be chosen, for example, for reasons of selectivity, etching rate, isotropy, cost, handling steps and wafer stress, among others. For example, in a plasma etcher, a $NF_3$, $CF_4$, or $SF_6$ plasma, among others, may be used to remove residue oxides and nitrides. A subsequent plasma etching using $BCl_3$ or $Cl_2$, among others, may be used to thin the bulk wafer material.

However, various thinning, chemicals and etching technologies may be used together, in succession, or in various combinations. For example, the wafer may be pre-thinned using a grind or CMP process prior to etching. In this manner, the wafer may be thinned while minimizing yield loss.

Figure 2A:
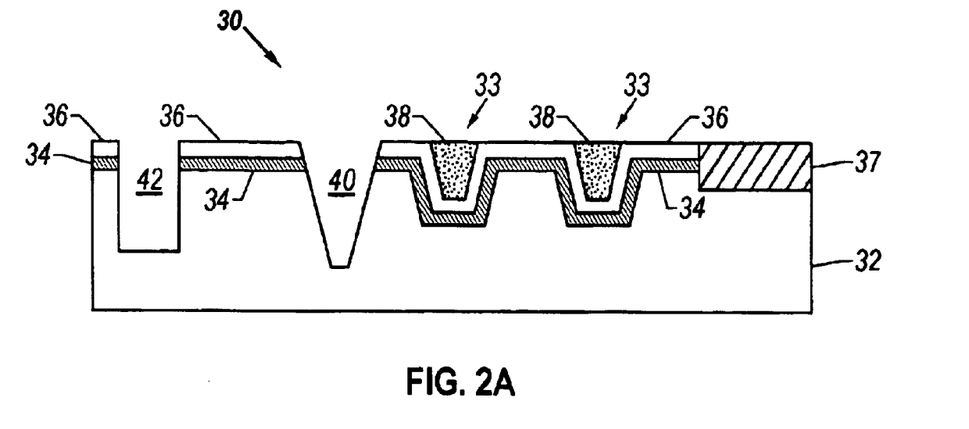
FIG. 2A is an cross sectional illustration of an exemplary embodiment of a wafer substrate.

FIG. 2A is a cross sectional illustration of another exemplary embodiment of a wafer. The wafer 30 may have a bulk wafer layer 32. In addition, the wafer 30 may have various devices constructed from various layers. For, example, the layers 34, 36, and 38 may be configured into devices, vias, wiring, contacts, and insulators, among others. The wafer may also have various scorings 40 and sinks 42, among others.

The devices, vias, contacts, and insulators, among others, may be manufactured, grown, etched, sputtered, deposited, and/or formed on the bulk material 32. In one exemplary embodiment, vias 33 may be formed. These vias 33 may, for example, be formed through etching the bulk substrate 32. The shape of the vias 33 may be varied. For example, an anisotropic plasma etch may produce a via with a substantially vertical profile. However, an isotropic plasma may produce a sloped wall via. Furthermore, various masked shapes may be used to produce various horizontal profiles.

A dielectric, insulative, or other material 34 may, for example, be layered on the surface of the etched bulk substrate 32. The material layer 34 may take the form of a polymer, undoped silicon oxide, silicon nitride, silicon oxynitride, or other insulator, among others.

A metal may, for example be deposited in a layer 36. The metal may, for example, be gold, aluminum, copper, or an alloy of tungsten, nickel, vanadium, or titanium, among others. However various other metals and alloys may be used. Further, the metal or metal alloy may be deposited or sputtered to form the layer 36.

A filler 38 may be used in the vias 33. The filler 38 may take the form of a glass, metal, polymer, conductor, or non-conductor, among others.

These vias 33 may be constructed in the wafer such that they may be exposed through the back side of the wafer 30 through wafer thinning or masked etching, among others. These vias 33 may, for example, extend 50 $\mu$m from the top surface of the wafer 30. However, the vias 33 may extend more or less than 50 $\mu$m. For example, they may extend 100 $\mu$m or 30 $\mu$m, among others. Further, both the shape and depth of the via may be a function of the final intended wafer thickness.

Furthermore, various devices and layers may be constructed on the bulk wafer material 32. These devices and layers may be formed using various technologies and methods. A via is one of many exemplary structures or devices which may be constructed on the front of a wafer. However, active devices 37 may be formed. These active devices 37 may have a depth less than that of the vias 33. For example, these active devices 37 may form transistors, resistors, capacitors, and barriers, among others.

The wafer may be partially diced, scored, cut, grooved, notched, cleaved and/or etched to produce a partial scoring 40. Similarly, the wafer may by partially impinged, cut, grooved, notched and/or etched to produce a hole 42.

The scoring 40 may, for example, have a depth of 50 $\mu$m from the top surface of the wafer 30. However, the scoring 40 may have a depth more or less than 50 $\mu$m. For example, the scoring 40 may have a depth of 100 $\mu$m or 30 $\mu$m, among others. In addition, the depth of the scoring 40 may be equal to, more than, or less than the depth of the via 33.

Similarly, the depth of the hole 42 may, for example, be 50 $\mu$m. However, the depth of the hole 42 may be more or less than 50 $\mu$m. For example, the hole may be 100 $\mu$m or 30 $\mu$m in depth, among others. Moreover, the hole may or may not have a similar depth to that of the vias 33 or score 40.

The scoring may, for example, be produced by a cutting tool such as a diamond tipped rotating blade. However, various tools may be used. These tools may include, for example, a laser such as an excimer laser, or a pressed blade, among others. The most common method of scoring or scribing wafers is via a diamond tipped rotating blade. However excimer lasers may be used both for scoring and forming deep vias which are opened by the wafer thinning process to form through die vias for electrical contact between the front and back sides.

The hole may be produced by a laser such as an excimer laser, for example. However, various other tools may be used. These tools may include dry and/or wet etch processes.

In addition, the hole and scoring may be produced by masking and etching techniques. For example, the masks used in producing vias and other devices may also be configured to produce the hole 42 and scoring 40. As an example, a photoresist mask may be used to protect the material surrounding the hole 42 or scoring 40. Subsequent etching may then produce the hole 42 or scoring 40. However, various configurations and combinations of mechanical, chemical, and etching processes may be used to produce the hole 42 and/or the scoring 40.

However, the vias 33, layers 34 and 36, hole 42, and score 40 are exemplary embodiments. Various other devices and markings may be envisaged. Furthermore, many techniques may be used to build, form, and/or structure, among other, these features.

Figure 2B:
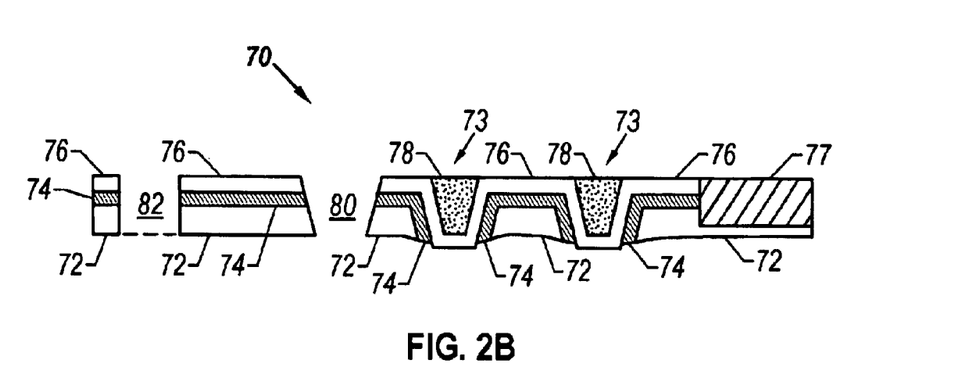
FIG. 2B is a cross sectional illustration of an exemplary embodiment of a wafer substrate.

FIG. 2B represents the cross sectional illustration of the exemplary embodiment 70 of FIG. 2A after the etching process or process to thin the wafer from the backside. The bulk wafer material 72 may have been etched to a depth that exposes the vias 73, hole 82, and scoring 80. However, the active devices 77 may not be exposed to the backside of the wafer.

In this exemplary embodiment, a metal layer 76 may be exposed through wafer thinning. A dielectric or insulatory layer 74 and the bulk wafer substrate 72 may have been etched to expose the layer 76. As such, a through-die via may be formed.

In another example, the scoring 80 may have exposed through wafer thinning. For example, the bulk wafer substrate 72 may have been etched to a depth exposing the scoring. If the scoring were to outline an IC chip, the chip would, as a consequence, be segregated from the wafer.

In a further example, a hole 82 may have been exposed through the wafer thinning. As such, the hole may represent a punch-through feature, a means of access through the wafer, and other features.

The bulk wafer substrate may be removed through various means. These means may include dry and/or wet etching. Bulk wafer material may be, for example, made of silicon, germanium or gallium arsenide. The typical instance of bulk wafer material is silicon and will serve as the example for this discussion. Silicon may be removed by either wet chemical reaction or dry chemical volatilization.

In the case of wet etching, the wafer is either immersed or sprayed while spinning with an etching chemical chosen to chemically combine with the silicon atoms and remove them from the exposed surface. High volume wet etch chemistries are typically composed of HF, HNO3 and/or CH3COOH, all of which pose either safety or environmental hazards or both. In addition to the safety and environmental concerns, wet etching requires a rinse to stop the process since residual acid can combine with humidity in air to continue the volatilization process after removal from the process environment.

Plasma processing has traditionally offered a relatively safer, more environmentally friendly and easier to control etch process. Typical plasma processing begins with what may be a stable and often relatively benign gas until it is disassociated into reactant species such as free atomic fluorine or chlorine. For this reason gases such as CF4, SF6, C3F8, Cl2, and BCl3 are typically used for silicon etching. The plasma is used as a chemical factory by disassociating these complex molecules into neutral reactant species, for example e+CF4=>CF3+F. A high pressure or even atmospheric pressure plasma discharge using the aforementioned process gases can produce large amounts of reactant. This reactant may, in turn, be focused onto the exposed wafer backside surface resulting in a high rate removal of the film.

However, other thinning techniques may or may not be combined with the etching techniques. For example, a wafer may be pre-ground before etching. For example, a 300 mm wafer may be pre-ground to a thickness greater than 300 $\mu$m and then etched to a desired thickness. In this manner, yield loss may be reduced.

Figure 2C:
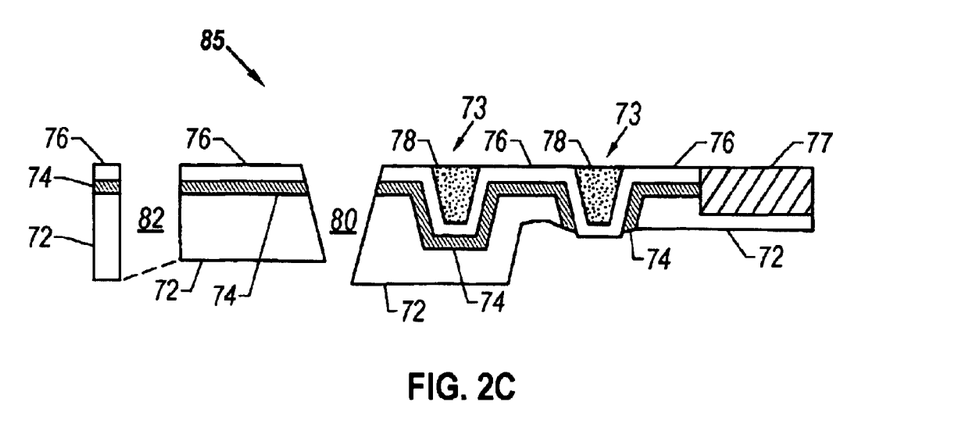
FIG. 2C is a cross sectional illustration of an exemplary embodiment of a wafer substrate.

Alternately, the etching may be masked creating backside structures on the wafer. FIG. 2C is an exemplary embodiment 85 of a wafer with varying depths of bulk wafer material. Through varying the depth, some devices may be exposed while others remain covered. Further, various structures, forms, and devices may be created for applications in, for example, micro-electro-mechanical device.

For example, an atmospheric plasma etching apparatus may be used to thin the back-side of the wafer. A mask may be applied to the wafer. When etching, the plasma chemistry may be varied to produce regions of varying thickness.

Figure 3A:
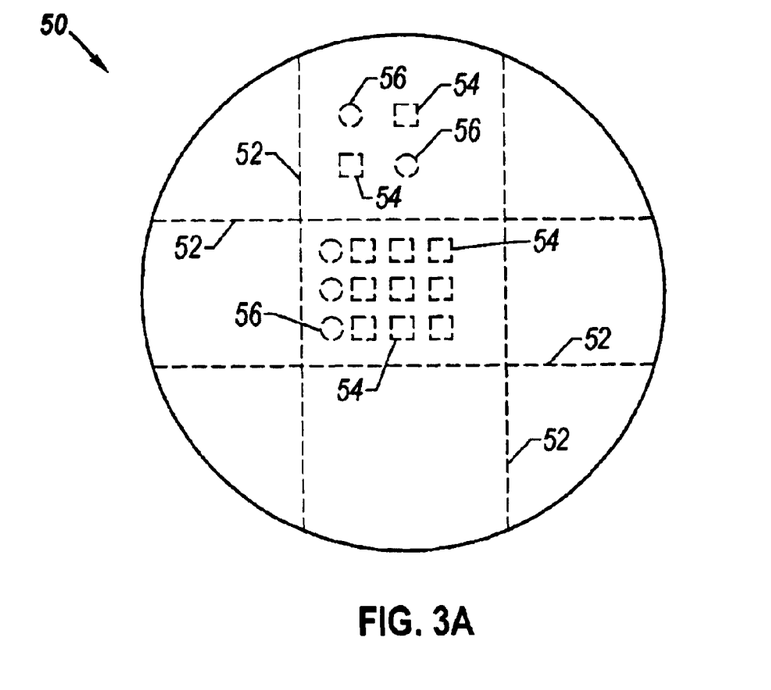
FIG. 3A is a backside view of an exemplary embodiment of a wafer substrate before wafer thinning.

FIG. 3A is a back-side view of an exemplary embodiment of a wafer. The wafer 50 may have grooves, scores, notches, or indents, among others 52. The wafer 50 may also have holes or grooves, 56. Further, the wafer 50 may have devices, vias, connectors, structures and contacts, among others 54.

The scores 52 may extend linearly or in curves along the front surface of the wafer 50. Similarly, the structures 54 may be manufactured near the front surface of the wafer 50. These structures 54 may be arranged in various configuration and may take various shapes. Furthermore, the holes 56 may be arranged in various configurations and may take various shapes.

The scores 52 may, for example, outline the edges of an IC chip manufactured about the wafer 50. Alternately, these scores 52 may represent indentations, structures, locations of unfilled structures, and texturing, among others.

The structures 54 may for example be devices such as transistors, resistors, capacitors, conductors, junctions, connections, conduits, and insulators, among others. In another example, the structures 54 may be vias. Similarly, the holes 56 may extend below the surface.

Figure 3B:
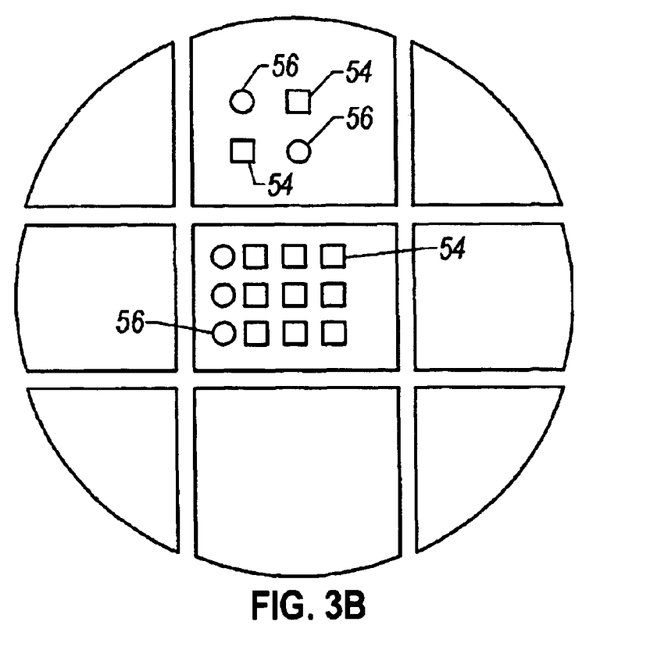
FIG. 3B is a backside view of an exemplary embodiment of a wafer substrate after wafer thinning.

FIG. 3B is an exemplary embodiment of the wafer 50 of FIG. 3A after removal of some, part or all of the bulk wafer material. In this exemplary embodiment, the scoring 52 of FIG. 3A has been exposed thereby segregating the wafer 50 into chips.

Further, the holes 56 and/or vias 54 may be exposed. As such, in this exemplary embodiment, physical and/or electrical access to the front-side and/or the front side devices may be achieved.

The holes 56, vias 54, and scoring 52 are exemplary embodiments of the structures, markings, and elements. The device may or may not have each of these. Further, the device may have various other devices and structures. Moreover, these various other devices and structures may or may not be exposed by back-side wafer thinning.

Figure 4:
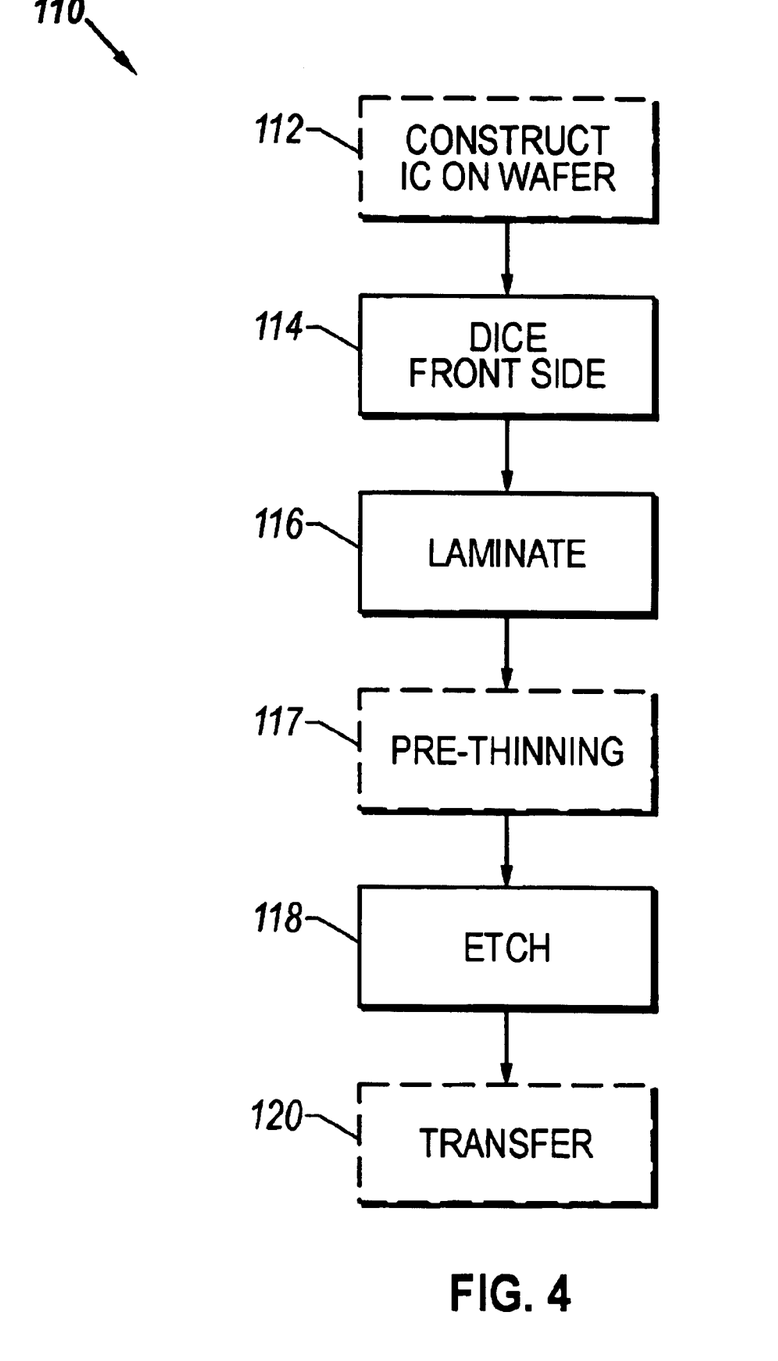
FIG. 4 is a block flow diagram of an exemplary embodiment of a method for manufacturing integrated circuits.

In an embodiment of the inventive method, the number of handling steps and processes is reduced. For example, FIG. 4 shows a block flow diagram of an exemplary method according to the invention. In the method 110, integrated devices may be formed on a first side of the wafer, as seen in a block 112. However, the formation of devices may or may not be a step in the method 110.

The wafer may be partially diced, cleaved, scored, etched, notched, cut, and/or grooved on the first side, as seen in a block 114. For example, the wafer may be partially diced using a diamond edged rotating blade, or an excimer laser, among others. Alternately, the scoring, notch, cut, or groove, among others may be created through masking and etching layers.

The wafer may then be laminated as seen in a block 116. Lamination may, for example, be performed by placing the wafer device side down onto a lamination tool which may, for example, consist of a roll of tape with the adhesive side facing up (to adhere to the device side of the wafer) for protection of the device side of the wafer during subsequent processes such as back side thinning. The lamination machine may be cut the tape along the wafer edges leaving only the device side covered. Lamination is important to protect the device side, especially any solder balls or redirection circuitry placed there as a part of either WLP or flip chip packaging processes during the subsequent back side thinning process. In addition, the laminated tape serves to hold the segregated die in place after the thinning process is complete to allow for the final pick and place of the finished devices. However, various other methods of lamination may be used.

The wafer may or may not be pre-thinned before etching as seen in a block 117. For example, the wafer may be mechanically ground before etching. However, this step may or may not be included in the method.

The wafer may be etched to remove bulk wafer material, as seen in a block 118. For example, the backside of the wafer may be etched using an atmospheric plasma etch process. Typical plasma etch processes used in the fabrication processes on the device side of the wafer require significantly high anisotropy and selectivity. In addition device side plasma processes much be extremely sensitive to wafer charging which can destroy the completed transistor gate oxide rendering the device useless. Backside processes however are not constrained by anisotropy or charging issues. Also after any residual films are removed from the top of the exposed back side, selectivity is no longer an issue. Hence backside plasma processing can be much more aggressive than device side. One technique to intensify the density of reactant species in a plasma process is to increase the pressure, which increases the number density of molecules which can be disassociated. Typical device side processes are significantly sub-atmospheric. Backside processes, however, can operate at much higher pressures up to and including atmospheric and beyond. Atmospheric pressure discharges are not very common in plasma processes and can require significant energy to sustain. However, tuned cavity microwave atmospheric sources operate efficiently on only a few kilowatts of power and at extremely high flow rates up to 100 liters per minute. The combination of these high flow rates at atmospheric pressure provides the unique capability of high rate etching. However, various plasma techniques may be implemented at various plasma pressures and energies.

As such, the wafer may be segregated into IC chips. These chips may then be transferred as seen in a block 120. For example, the chips may be removed from the tape lamination and mounted. When the chips are removed they may go onto direct attach applications on a PCB or into some multi-chip module configuration which then gets mounted onto the PCB, among others. However, the step of transferring may or may not be included in the method.

Figure 5:
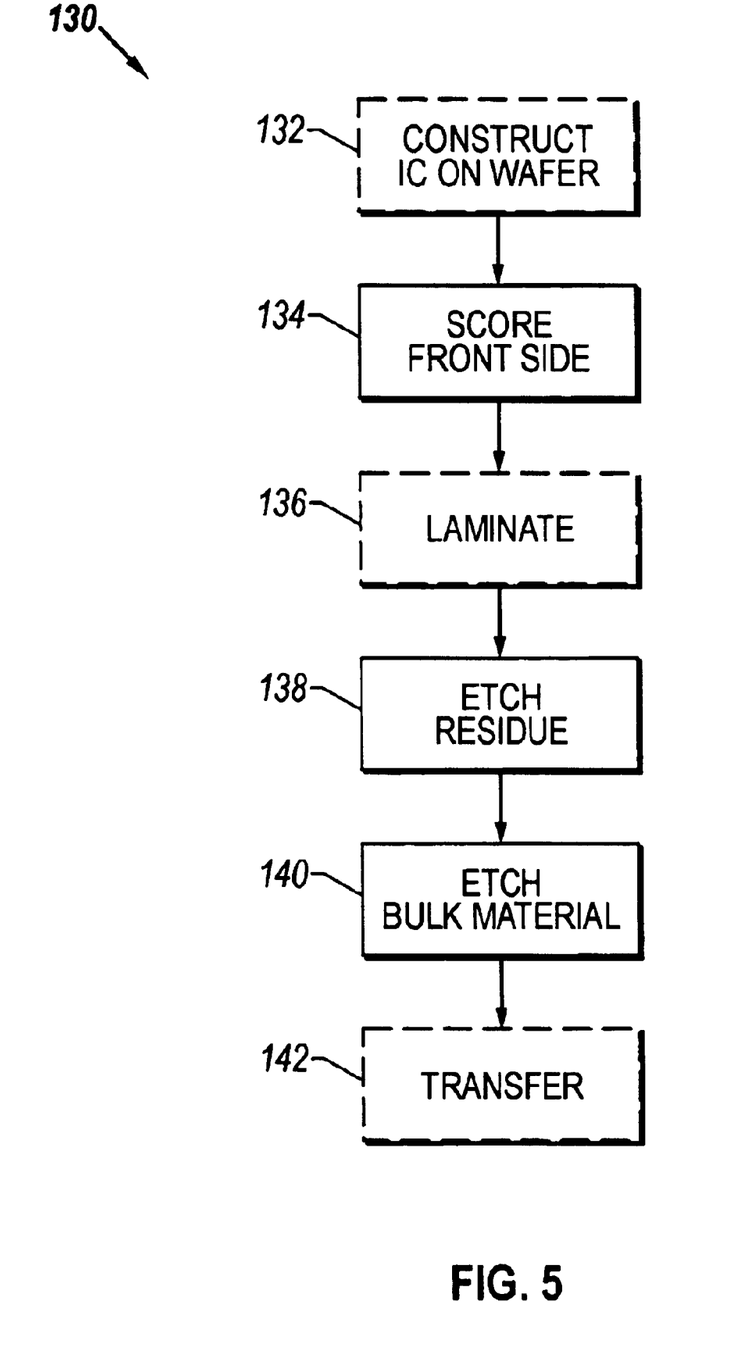
FIG. 5 is a block flow diagram of an exemplary embodiment of a method for manufacturing integrated circuits.

In another exemplary method 130 as seen in FIG. 5, integrated devices may be formed on a first side of the wafer, as seen in a block 132. However, the formation of devices may or may not be a step in the method 130.

The wafer may be partially diced, cleaved, scored, etched, notched, cut, and/or grooved on the first side, as seen in a block 134. For example, the wafer may be partially diced using a diamond edged rotating blade, or an excimer laser, among others. Alternately, the scoring, notch, cut, or groove, among others may be created through masking and etching layers.

The wafer may then be laminated as seen in a block 136. Lamination may, for example, be performed by various techniques. However, the method 130 may or may not include the step of laminating.

The wafer may be etched to remove the residue layer, as seen in a block 138. The residue layer may, for example, consist of various materials including silicon dioxide, silicon nitrate, various photoresist polymers, dopants, metals, metal oxides, dust, oils, substrate particles, and/or various combinations, among others. This material may be etched using a dry etch and/or wet etch process. For example, the residue may be removed through a wet etch using very aggressive high etch rate chemistries such as HNO3 and HF. Alternately, the residue may be removed using a dry etch. For example, a residue consisting of silicon dioxide, silicon nitride, and/or oxynitrides of silicon, among others, may be etched using a fluorine plasma etching chemistry. However, various other etching chemicals and methods may be used.

The wafer may be etched to remove bulk wafer material, as seen in a block 140. For example, the backside of the wafer may be etched using an atmospheric plasma etch process.

Moreover, the residue and bulk wafer material may be removed using the same apparatus. For example, a plasma etcher may be charged with a fluorine gas compound for etching the residue. Subsequently, the plasma etcher may be charged with a chlorine gas compound for etching the bulk material. However, various methods and chemistries may be envisaged. Further, various combinations of gases may be used to remove the residue and wafer material. Furthermore, the bulk material and residue may be removed simultaneously.

As such, the wafer may be segregated into IC chips by exposing the scoring. These chips may then be transferred as seen in a block 142. For example, the chips may be removed from the tape lamination and mounted. However, the step of transferring may or may not be included in the method.

Figure 6A:
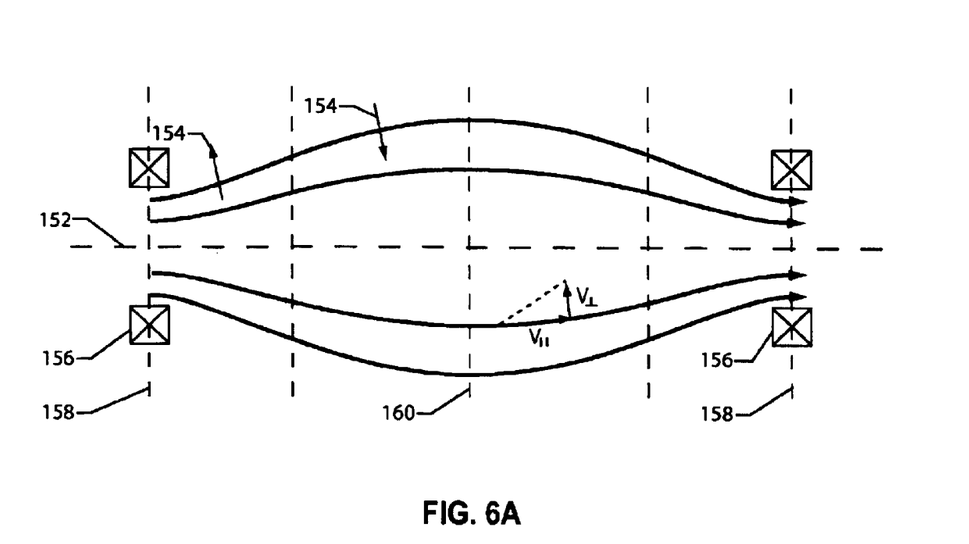
FIG. 6A is a diagram of a plasma chamber using a magnetic mirror field as an exemplary embodiment of the magnetic mirror plasma etching technique.

FIG. 6A is a diagram of a plasma chamber using a magnetic mirror field as an exemplary embodiment of the magnetic mirror plasma etching technique. The magnetic mirror field is oriented along the axis 152 of a plasma chamber such that the axial magnetic field density 154 may be varied simply by symmetrically or asymmetrically changing the electrical current flow in the solenoid coils 156. In FIG. 6A one of skill in the art will recognize that $B_{max}$ 158 is located near the solenoid coils 156 and $B_{min}$ 160 is located between the solenoid coils 156.

Figure 6B:
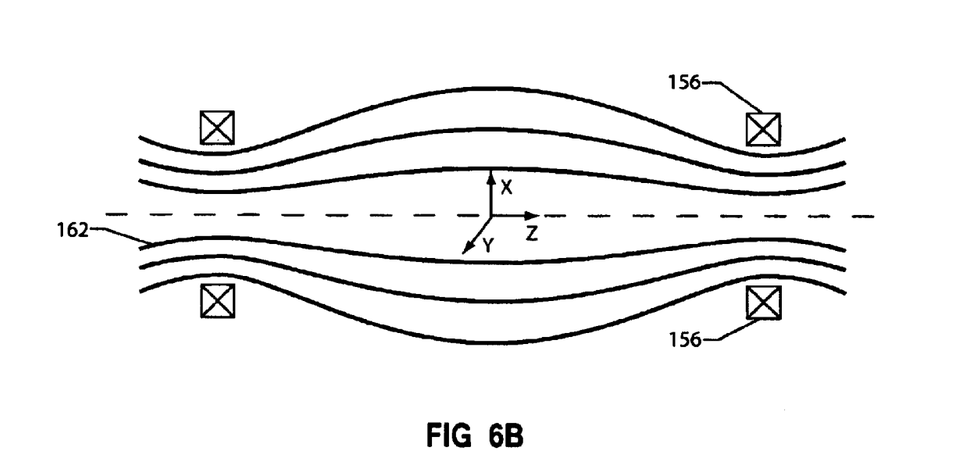
FIG. 6B is a diagram illustrating how a magnetic mirror field of an exemplary embodiment of the magnetic mirror plasma etching technique is oriented along the axis of the plasma chamber.

FIG. 6B is a diagram illustrating how a magnetic mirror field of an exemplary embodiment of the magnetic mirror plasma etching technique is oriented along the axis of the plasma chamber. FIG. 6B also illustrates how symmetrically varying the electrical current in the solenoid coils 156 varies the axial magnetic field density, as shown by magnetic mirror field lines 162.

Figure 6C:
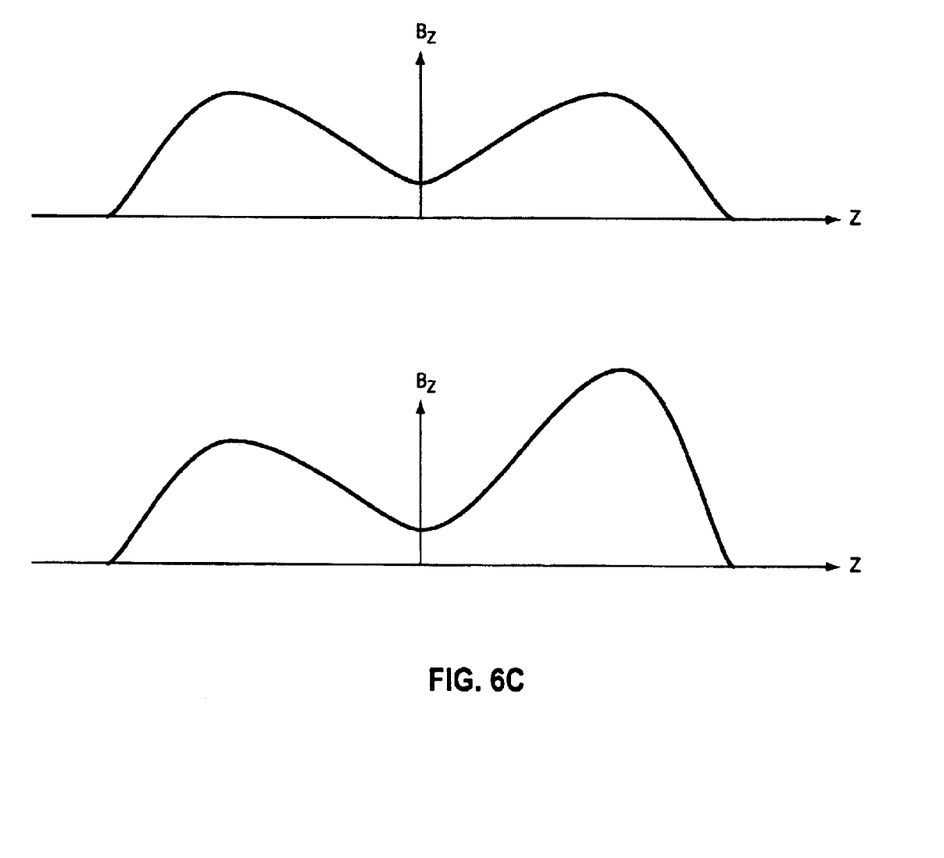
FIG. 6C is a diagram illustrating how the shape of a magnetic mirror field of an exemplary embodiment of the magnetic mirror plasma etching technique may be modified.

FIG. 6C is a diagram illustrating how the shape of a magnetic mirror field of an exemplary embodiment of the magnetic mirror plasma etching technique may be modified. FIG. 6C also illustrates how the shape of a magnetic mirror field (shown by magnetic mirror field strength lines 164) of an exemplary embodiment of the confined plasma etching technique may be modified by an asymmetrical change of the electrical current flow in the solenoid coils 156.

Figure 7:
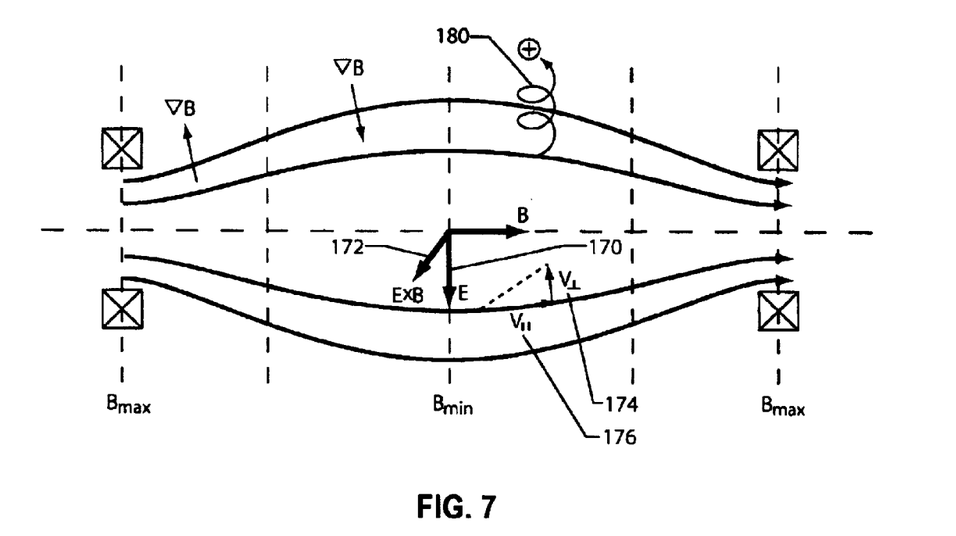
FIG. 7 is a diagram of a magnetic mirror field of an exemplary embodiment of the magnetic mirror plasma etching technique showing an electric field normal to the magnetic mirror field lines.

FIG. 7 is a diagram of a magnetic mirror field of an exemplary embodiment of the magnetic mirror plasma etching technique showing an electric field 170 normal to the magnetic mirror field lines 162, E X B field drift 172, ion velocity vector normal to the field lines 174, and ion velocity vector parallel to the field lines 176.

The ability to symmetrically or asymmetrically drive the magnetic mirror coils provides not only the ability to significantly alter the angular momentum of trapped charges on the magnetic mirror field lines (also known as flux lines) to increase or decrease disassociation, but it also provides the ability to alter the component of the ion velocity vector normal to the field lines (and the substrate surface). The ability to magnetically steer the ions provides unique capability to provide as much or little ion activation energy as necessary to remove residual films from front side processes. However, no amount of asymmetrical drive current to the coils will result in a zero component of the ion velocity vector normal to the substrate surface, short of destroying the magnetic mirror field altogether. Rather an electric field normal to the mirror field lines provides the E X B field drift sufficient to dislodge the ions from flux lines and create a diffusion perpendicular to the flux lines as depicted by item 180.

Figure 8:
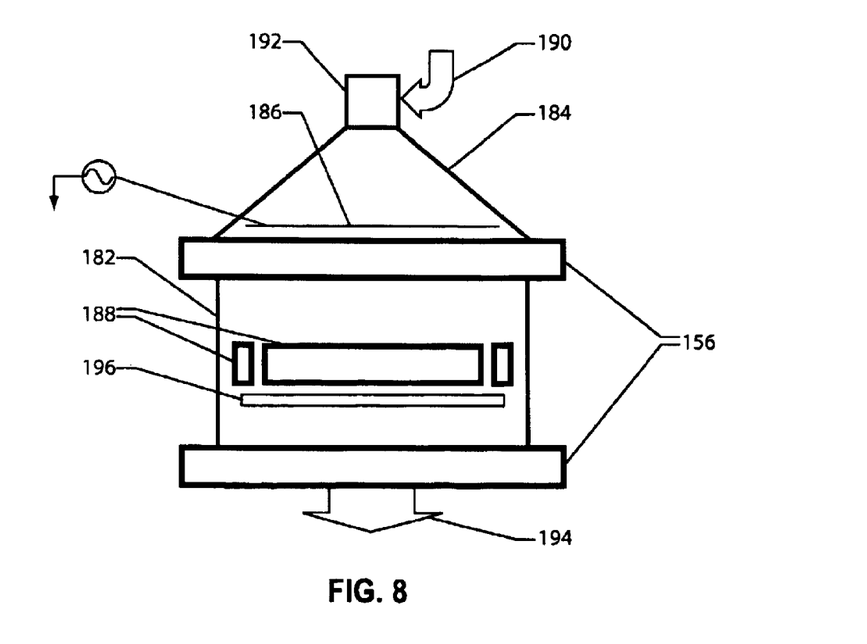
FIG. 8 is a diagram of a magnetic mirror field of an exemplary embodiment of the magnetic mirror plasma etching technique showing the completed magnetic and electric confinement technique along with various components of the preferred magnetic mirror plasma. Corresponding reference numerals indicate corresponding parts throughout the several views of the drawings.

FIG. 8 is a diagram of a magnetic mirror field of an exemplary embodiment of the magnetic mirror plasma etching technique showing the completed magnetic and electric confinement technique along with various components of the preferred magnetic mirror plasma chamber. The components shown in FIG. 8 comprise the plasma chamber of the preferred embodiment except for substrate 196. The plasma chamber comprises a diffuser 184, extraction grid 186, magnetic mirror coils 156, electrodes 188 for rotating the magnetic mirror electric field (discussed below), process gas inlet 190, arc source 192, and vacuum port 194.

The plasma chamber of the preferred embodiment of the magnetic mirror plasma provides, among other things, the ability to control the pressure at which the plasma is operated, which in the preferred embodiment is at a pressure lower than atmospheric (created through use of a vacuum pump (not shown) connected to the plasma chamber through vacuum port 194. The substrate 196 to be processed is mounted within the plasma chamber 182 using a substrate holder (not shown) which comprises an electrostatic chuck with appropriate thermal controls to maintain acceptable substrate temperature during processing.

Ion extraction grid 186 is used to launch ions from a source onto the magnetic mirror flux lines. The ion extraction grid 186 may be used simply to locate ions on the field lines or to add to the field parallel component of the ion velocity vector 176 (see FIG. 7). FIG. 8 also shows the general placement of an ion source, which is depicted in the preferred embodiment of the magnetic mirror plasma as generated from a process gas introduced into the plasma chamber 182 through process gas inlet 190 and arc source 192. The type of ion source may be varied based on the desired application and the desired operating pressure (which may be above, below, or at atmospheric pressure but in the preferred embodiment is below atmospheric pressure). In addition, the ion source may be varied from microwave coupled, helicon, arc, or other ion sources of specific designs suitable to specific applications of the magnetic mirror plasma.

The electric field used in the magnetic mirror plasma etching technique is created in a rotating fashion to sweep the E X B field drift vector 172 in a radial direction perpendicular to the magnetic mirror field lines. This is accomplished with two pair of electrodes 188, which are located perpendicular to each other and the magnetic mirror field coils 156. The electrodes 188 are driven by a sinusoidal signal of variable period. In addition, the drive signal is phase shifted 90 degrees between the two pair of electrodes so as to create a rotating effect.

As such, a system and method for manufacturing integrated circuits is described. In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

What is claimed is:

1. A method for segregating an integrated circuitry chip from a wafer, the method comprising:

circumscribing the integrated circuitry chip with at least one recess, said at least one recess having a particular depth extending into the wafer from a front side of the wafer; and etching bulk wafer material from a back side of the wafer to achieve a particular thickness of the wafer, said thickness of the wafer being at most equal to said particular depth;

wherein said etching step comprises use of a magnetic mirror plasma chamber which is controlled using a magnetic mirror field and an orthogonally rotating electric field.

2. The method of claim 1 wherein said step of etching bulk wafer material comprises etching at atmospheric pressure.

3. The method of claim 1 wherein said particular depth is at most equal to a depth of at least one integrated circuitry feature.

4. The method of claim 3 wherein said at least one integrated circuitry feature is a via.

5. The method of claim 1, the method further comprising the step of:

forming a recess extending from the front side of the wafer, the recess having a depth at least equal to said particular depth.

6. The method of claim 1, the method further comprising the step of removing through mechanical grinding a portion of the bulk wafer material from the back side of the wafer.

7. A system for segregating an integrated circuitry chip from a wafer, the system comprising:

means for circumscribing the integrated circuitry chip with at least one recess on a front side of the wafer, said at least one recess having a particular depth; and etching means for removing bulk wafer material from a back side of the wafer to achieve a particular thickness of the wafer, said thickness of the wafer being at most equal to said particular depth;

wherein said etching means comprises a magnetic mirror plasma chamber which is controlled using a magnetic mirror field and an orthogonally rotating electric field.

8. The system of claim 7 wherein said etching means comprises an atmospheric plasma etcher.

9. The system of claim 7 wherein said particular depth is at most equal to a depth of at least one integrated circuitry feature.

10. The system of claim 7, further comprising means for laminating said front side of the wafer.

11. The system of claim 7, further comprising means for transferring the integrated circuitry chip.

12. The system of claim 7, the system further comprising etching means for removing a residue material from said back side of the wafer.

13. The system of claim 7, the system further comprising means for forming a recess extending from the front side of the wafer, the recess having a depth at least equal to said particular depth.

14. The System of claim 7 wherein said plasma chamber is constructed of essentially non-ferrous materials.

15. A method for segregating an integrated circuitry chip from a wafer and exposing at least one integrated circuitry feature, the at least one integrated circuitry feature having a depth extending from a front side of the wafer, the method comprising:

circumscribing the integrated circuitry chip with at least one recess on the front side of the wafer, said at least one recess having a particular depth; and etching bulk wafer material from a back side of the wafer to achieve a particular thickness of the wafer, said thickness of the wafer being at most equal to one integrated circuitry feature and at most equal to said particular depth;

wherein said etching step comprises use of a magnetic mirror plasma chamber which is controlled using a magnetic mirror field and an orthogonally rotating electric field.

16. The method of claim 15 wherein said step of etching bulk wafer material comprises the step of etching at atmospheric pressure.

17. The method of claim 15 wherein said step of etching bulk wafer material comprises the step of etching with a plasma at atmospheric pressure.

18. The method of claim 15, wherein the magnetic mirror plasma chamber is constructed of essentially non-ferrous materials.

19. The method of claim 15, wherein the magnetic mirror plasma chamber is constructed of essentially non-ferrous materials, and wherein the plasma ions are created remote to the plasma chamber.

* * * * *